Figure 1:
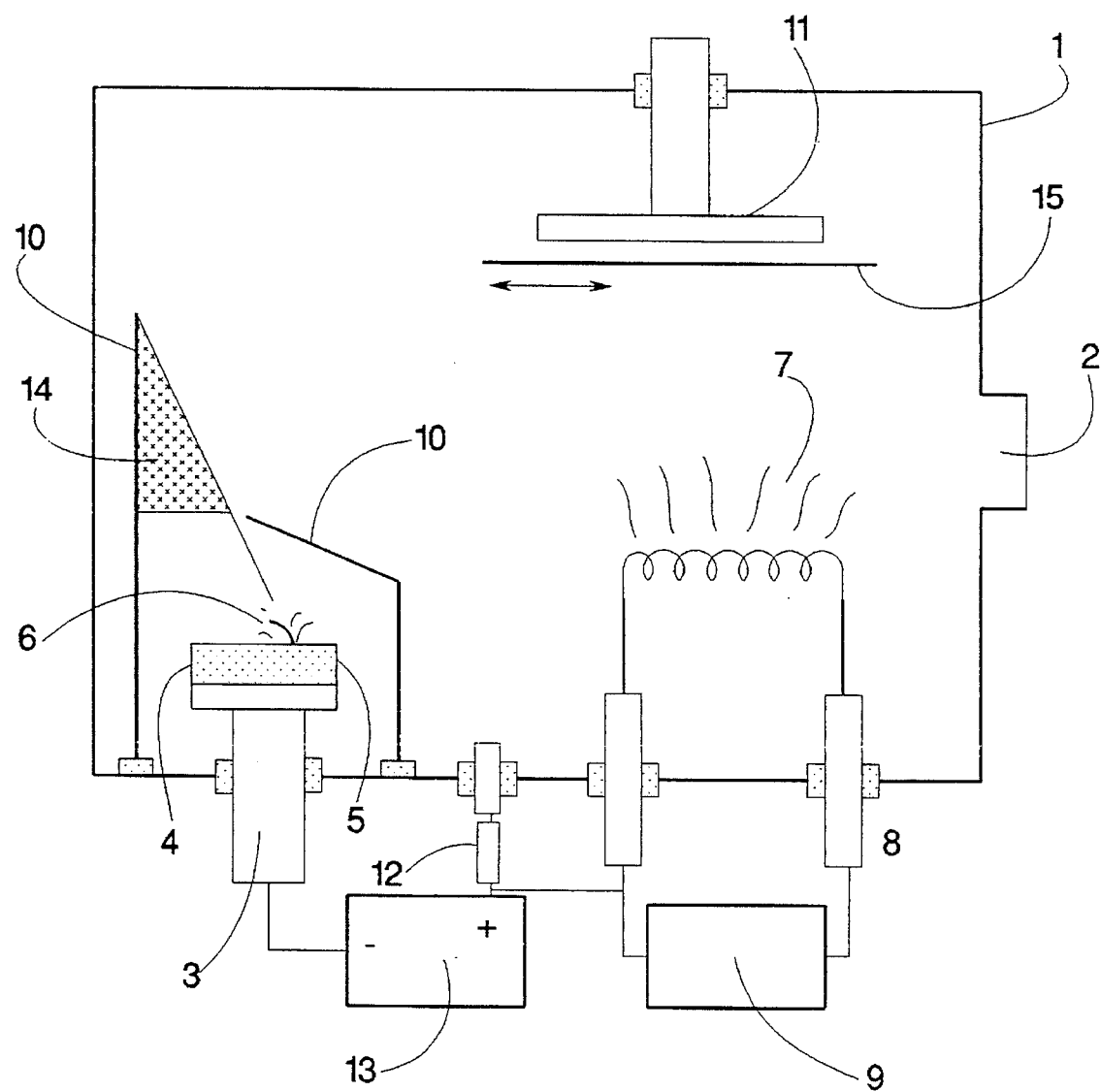

United States Patent [19]

Ehrich

[11] Patent Number: 5,662,741
[45] Date of Patent: Sep. 2, 1997

[54] PROCESS FOR THE IONIZATION OF THERMALLY GENERATED MATERIAL VAPORS AND A DEVICE FOR CONDUCTING THE PROCESS

[75] Inventor: Horst Ehrich, Dorsten, Germany

[73] Assignee: Plasco Dr. Ehrich Plasma-Coating GmbH, Heidesheim, Germany

[21] Appl. No.: 256,556

[22] PCT Filed: Jan. 6, 1993

[86] PCT No.: PCT/EP93/00009

§ 371 Date: Sep. 22, 1994

§ 102(e) Date: Sep. 22, 1994

[87] PCT Pub. No.: WO93/14240

PCT Pub. Date: Jul. 22, 1993

[30] Foreign Application Priority Data

Jan. 10, 1992 [DE] Germany .................... 42 00 429.2

[51] Int. Cl.$^6$ ................................. C23C 16/00
[52] U.S. Cl. ....................... 118/723 VE; 118/723 HL
[58] Field of Search ............... 118/723 VE, 723 HL; 204/298.41, 298.11, 192.38

[56] References Cited

FOREIGN PATENT DOCUMENTS

| 0385283 | 9/1990 | European Pat. Off. . |
| 4042337 | 9/1991 | Germany . |

OTHER PUBLICATIONS

M. Mausbach et al., "Relations between plasma properties and properties of thin copper films produced by an anodic vacuum arc", Materials Science & Engineering, vol. A140 (1991), 825–829.

*Primary Examiner*—John Niebling
*Assistant Examiner*—Joni Y. Chang
*Attorney, Agent, or Firm*—McDonnell Boehnen Hulbert & Berghoff

[57] ABSTRACT

The present invention is directed to a process for ionizing material vapors generated thermally at reduced pressure, characterized in that the material vapors are exposed to electrons from the cathode spots 6 of a self-consuming cold cathode 3, 4, the thermal vaporization device 7 being connected as an anode, so that a vacuum arc discharge forms between cathode 3, 4 and anode 7. Another objective of the invention is a device for operating said process, wherein in a vacuum chamber 1, there is arranged a coolable cathode holder 3 having the cathode material 4 applied thereon for generating cathode spots on the self-consuming cold cathode, a thermal material vaporization system 7, 8, 9 connected as an anode, a wall 10 surrounding the cathode and connected as an auxiliary anode, which wall has an opening opposite the cathode.

11 Claims, 1 Drawing Sheet

PROCESS FOR THE IONIZATION OF THERMALLY GENERATED MATERIAL VAPORS AND A DEVICE FOR CONDUCTING THE PROCESS

This invention relates to a process for the ionization of material vapors generated thermally at reduced pressure and a device for conducting the process.

It is generally known that the use of ionized material vapors in coating substrates from a vapor phase results in significant improvement of various layer characteristics. In particular, by using plasma- and ion-based processes, higher adherence of the coating on substrate surfaces as well as higher compactness of the layer structure may be achieved. Furthermore, there is the possibility of conducting reactive coating processes.

In order to generate ionized material vapors, electrical discharges are used. Here, according to physical aspects, a distinction is made between glow discharges and arc discharges.

Glow discharges include cathode sputtering. Arc discharges are classified as discharges constrained to process gas using hollow cathodes according to U.S. Pat. No. 3,562,141 or glow cathodes according to U.S. Pat. No. 4,197,175, and vacuum arc discharges with self-consuming cathode according to U.S. Pat. No. 4,562,262, or self-consuming cathode and hot self-consuming anode according to U.S. Pat. No. 4,917,786.

Further, from DE-A-30 42 337, there is known a vacuum arc discharge having a controlledly adjustable degree of ionization. In the process described therein, vapor deposition rate and degree of ionization are highly interdependent in order to control the latter. Furthermore, the control of the degree of ionization described therein requires mechanical motion in vacuum.

All the above-mentioned processes have in common that the vaporization material must be arranged in a process-specific fashion. Conventional thermal vaporizers are not part of the processes mentioned. These include resistance- or induction-heated crucibles or vaporizer helices as well as material vaporization using an electron beam. Material vapors generated by thermal vaporizers are non-ionized. Several methods for the ionization of such material vapors are already known.

The DE-A-39 31 565 describes a method according to which the thermally generated vapor is admixed with ions of a gaseous starting material, typically argon or nitrogen. These ions are generated in a separate ion source. Therefore, the issue concerned here is not ionization of material vapor but material vapor which is admixed with ions of a gaseous starting substance.

U.S. Pat. No. 4,039,416 and U.S. Pat. No. 4,342,631 describe processes for generating ionized material vapors, wherein the material vapors are generated by means of thermal vaporization (induction or resistance heating). Ionization of these material vapors in the vicinity of the workpiece to be coated is effected by the coupling of high frequency electromagnetic waves (RF heating). The advantage in this method is that pure plasma of the material vapor is produced without employing a process gas. However, RF discharges are difficult to control, particularly on a larger industrial scale, and require shielding measures to avoid spurious radiation.

Furthermore, from U.S. Pat. No. 3,756,193 and U.S. Pat. No. 4,461,689, there is known a process wherein the material vapor generated by an electron beam is ionized by means of a d.c. glow discharge. In order to maintain such glow discharge, the material vapor must be admixed with a process gas. The principle of this process called "ion plating" was first described in U.S. Pat. No. 3,329,601.

A drawback in ion plating is that in practice, this process is restricted to a laboratory scale. With increasing size of the vaporization apparatus or the substrate surface, the tendency of a d.c. glow discharge to turn into an arc discharge is greatly increased. At a critical size of apparatus and thus, above a critical value of the discharge current, the arc will always be the form of discharge preferred over the glow discharge. This changing into an arc discharge may result in considerable damage in vapor source or substrate. Another drawback is the use of high voltage and the use of a process gas which frequently adversely affects the coating quality.

The U.S. Pat. No. 4,448,802 describes a process wherein material vaporized by means of an electron beam is ionized using a low voltage arc. This low voltage arc is process gas-based and is operated between the crucible containing the vaporization material and a glow cathode. Due to the process gas pressure necessary in the cathode region, this glow cathode is located in a separate cathode chamber connected with the vaporization area through an opening designed as a pressure stage. The process-technologically necessary application of process gas results in participation of the process gas in layer formation, which is often undesirable.

Thus, the technical problem of the present invention is to develop a process which ionizes the material vapor generated using conventional thermal vaporizers and avoids the above-described drawbacks—for example, use of a process gas, coupling of high frequency electromagnetic waves, and use of high voltage—, is easily integrated into already existing thermal vaporization equipment, and may be employed on a large industrial scale.

This technical problem is solved by a process for ionizing material vapors generated thermally at reduced pressure, characterized in that the material vapors are exposed to electrons from the cathode spots 6 of a self-consuming cold cathode 3, 4, the thermal vaporization device 7 being connected as an anode, so that a vacuum arc discharge forms between cathode 3, 4 and anode 7. In a preferred embodiment, the plasma stream emerging from the cathode spots is shielded from the thermal vaporization device 7 by a wall 10 surrounding the cathode (see FIG. 1.).

In another preferred embodiment, the plasma stream generated in the cathode is directed onto the shielding wall 10. The wall 10 may be connected as an auxiliary anode.

Another objective of the invention is a device for operating the above-described process (FIG. 1), wherein in a vacuum chamber 1, there is arranged a coolable cathode holder 3 having the cathode material 4 applied thereon for generating cathode spots on the self-consuming cold cathode, a thermal material vaporization system 7, 8, 9 connected as an anode, a wall 10 surrounding the cathode and connected as an auxiliary anode, which wall has an opening opposite the cathode. An ignition device 5 is arranged at the cathode.

In a preferred embodiment, there is arranged in the vacuum chamber 1 a material 11 to be coated with the ionized material vapor, which may be covered with a shiftable screen 15.

The process of the invention will be described in detail as follows:

After switching on the supply unit 13, cathode spots 6 are generated on the cathode material 4 via ignition mechanism 5. An auxiliary arc is formed between the cathode 4 and the wall 10 connected as an auxiliary anode. At the same time, the thermal vaporization system 7 is activated by energy supply 9, so that the material connected with the vaporization device is allowed to evaporate. Due to the voltage drop over resistor 12, the vaporization system 7 being connected as main anode invariably is on a more positive potential than the auxiliary anode 10. Therefore, electrons will be accelerated from region 14 towards the vaporization system. Via inelastic impact, these electrons ionize the material vapor flowing off from the vaporization system 7, so that particularly in areas of high vapor density in the vicinity of 7, an intense anodic plasma is formed. Ionization of this plasma will be substantially influenced by providing electrons within the area 14, i.e., by the charge carrier density in the cathodic plasma stream.

With sufficiently high ionization at the vaporization system 7, a self-sufficient arc discharge forms between cathode 4 and anode 7. Here, area 14 assumes the function of an "electron supplier". Thus, area 14 may also be regarded as a "virtual cathode". The plasma flowing out of the plasma cloud around 7 may be utilized for coating purposes. Since no process gas is used, ionization of material vapor will be maintained up to great distances (about 1 m). Once the arc between cathode 4 and anode 7 has formed, it is possible to adjust practically independently of each other the evaporation rate by regulating the energy supply 9 of the thermal vaporization system 7 and the degree of ionization by regulating the supply unit 13, respectively. Here, additional heating of the vaporization material occurs due to electrons impinging the vaporization system 7. Once the process parameters with respect to vapor deposition rate and ionization are reached, coating of the substrate 11 with the generated plasma may be effected after removing the shiftable screen 15 covering substrate 11.

During the coating process, vapor deposition rate and ionization may be controlled and modified according to a defined program. Since no process gas is used, there is no interference of layer growth.

Ions formed in the vicinity of the thermal vaporization device 7 may be accelerated by applying a bias voltage. Ion acceleration towards the substrate is possible with both electrically conductive and electrically non-conductive substrates (cf., H. Ehrich et al., "IEEE Transactions on Plasma Science", Vol. 18, No. 6, 895, December 1990).

Once the vaporization material in the vaporization system 7 is consumed, the arc will die out by itself, since there is no longer plasma present between area 14 and the wall 10 and the thermal vaporization device 7. The consumed vaporization material may be supplied to the vaporization system 7 during the coating process. With respect to geometrical shape and size as well as to material, the cathode 3, 4 may be designed most variably, so that both long cathode residence periods and safe arc operation are achieved.

The process of the invention will ionize the material vapor generated using conventional thermal vaporizers, wherein controlledly adjustable ionization of this material vapor is possible and at the same time, adjustment of the evaporation rate independent of the degree of ionization is permitted. Contamination of the material vapor is avoided by covering the cathode.

Operation may proceed without use of a process gas, application of high voltage and high frequency.

By low-cost rearrangement of already existing vacuum evaporation apparatuses, the process according to the invention may be conducted in same. The process may be employed on a large industrial scale and, in particular, is superior over hitherto processes in that it permits independent control of the degree of ionization and evaporation rate.

Namely, the process of the invention decouples vapor generation and ionization of the vapor to a large extent. Substantially, the evaporation rate from the vaporization system 7 is determined by the energy supply from the supply unit 9, while the ionization is adjusted by the arc current flowing through the arc between cathode 4 and anode 7. Moreover, the arc operation via "virtual cathode" 14 ensures decoupling of the material streams of cathode 4 and anode 7. Such decoupling prevents contamination of the plasma flowing off from anode 7 with cathode material when different materials at cathode 4 and anode 7 are used. Current flow within the arc is maintained through contact of cathodic and anodic plasma, thus creating and maintaining an electrically conductive connection between the electrodes. In particular, these advantages are useful in view of an automatized operation of the process on a large technical scale.

FIG. 1 illustrates a device for operating the process according to the invention.

It exemplifies a vacuum chamber 1 which may be evacuated via pump branch 2. In the vacuum chamber—and electrically isolated from same—a coolable cathode holder 3 is arranged which, at its front end, accommodates the cathode material 4. By means of the ignition device 5, cathode spots 6 may be generated on the operating area of the cathode, which may be fixated at the zone of the cathode operating area using known methods. These known methods include the use of magnetic fields (according to U.S. Pat. No. 4,551,221) or the limitation of the operating area by a suitable material (according to DE-A-40 42 337).

The vacuum chamber further contains a thermal vaporization system 7, 8, 9 exemplified in FIG. 1 as a vaporizer helix 7 connected to an electrical supply unit 9 via electrically isolated ducts. Instead of the vaporizer helix 7 exemplified in FIG. 1, any other known thermal vaporizer system—such as resistance- or induction-heated crucibles as well as materials heated by electron or laser beams—may be used.

The cathode 4 is surrounded by walls 10, on which the material condenses which is removed from the cathode spots 6 of the cathode material 4. The walls 10 are designed such that the material removed from the cathode spots 6 is kept away from both the vaporizer 7 and the substrate 11 in order to avoid contamination of anode 7 and/or the material 11 to be coated by cathode material.

Furthermore, the wall 10 or part of same serves as an auxiliary anode to ignite and maintain the arc discharge. To this end, the wall 10 is arranged electrically isolated from the vacuum chamber and is connected to the positive output of the arc supply unit 13 via resistor 12 of preferably from 0.3 to 1 $\Omega$. It is also possible to electrically connect wall 10 with vacuum chamber 1. In this case, the resistor 12 will connect the positive output of the arc supply unit 13 with the vacuum chamber.

The wall 10 is designed such that the plasma flow emerging from the cathode spots 6, via openings reaches an area 14 of the vacuum chamber wherein the plasma streams emerging from the cathode spots and the material streams emerging from the vaporizer come in contact.

Screen 15 permits shielding from switch-on and switch-off procedures at the substrate 11 to be coated.

When operating the process according to the invention, care must be taken that the supply units 9, 13 do not influence each other circumstantially. Such influence may be avoided by suitable electrical connecting measures between the supply units. Necessity and type of such connecting measures depend on the principles used to generate the supply voltages in the supply units 9, 13.

In particular, the process according to the invention and the device of the invention for operating said process may be used in coating surfaces using ionized material vapors in vacuum.

I claim:

1. A process for ionizing thermally generated material vapors comprising, in combination:

(a) generating said vapors in a vacuum chamber by applying a thermal evaporation device to vaporize a solid in said chamber, said thermal evaporation device operating at an evaporation speed and being activated by an energy supply;

(b) generating electrons from cathode spots of a cold cathode in said chamber, said cold cathode being powered by a power supply substantially independent of the energy supply of said thermal evaporation device;

(c) exposing said vapor to said electrons by operating said thermal evaporation device as an anode in relation to said cold cathode, so that a vacuum arc discharge having an arc discharge current forms between said cold cathode and said thermal evaporation device as anode, whereby said vapor is ionized by said electrons;

(d) controlling said evaporation speed by adjusting power input to said thermal evaporation device from said energy supply, substantially independent of said arc discharge current; and (e) controlling ionization of said vapor by adjusting power supplied to said cathode by said power supply and thereby adjusting said arc discharge current.

2. A process as claimed in claim 1, wherein a plasma stream emerges from said cathode spots, and said process further comprises the step of shielding said plasma stream from a direct line of sight to said thermal evaporation device, by employing a shielding wall between said cold cathode and said thermal evaporation device.

3. A process as claimed in claim 2, wherein said plasma stream is directed onto said shielding wall.

4. A process as claimed in claim 2, further comprising the step of operating said shielding wall as an auxiliary anode to said cold cathode.

5. A process for ionizing thermally generated material vapors, comprising, in combination, the following steps:

(a) supplying power and an ignition to a cathode material in said vacuum chamber, to generate cathode spots on said cathode material;

(b) supplying power to a thermal vaporization system in said vacuum chamber, thereby causing a material connected with said vaporization system to evaporate in said chamber, said thermal vaporization system serving as a main anode to said cathode and operating at a vaporization rate;

(c) employing a shielding wall around said cathode material, said shielding wall blocking a direct line of sight between said cathode and said main anode, and said shielding wall serving as an auxiliary anode to said cathode so that a cathodic plasma stream of electrons accumulates at said shielding wall;

(d) configuring said thermal vaporization system to have a more positive potential than said shielding wall, so that at least a portion of said electrons are accelerated from said shielding wall towards said vaporization system, thereby forming a vacuum arc discharge between said cathode and said thermal vaporization system, and thereby causing said electrons to ionize said vapor at an ionization rate;

(e) controlling said vaporization rate substantially independent of said ionization rate by adjusting said power supplied to said thermal vaporization device; and (f) controlling said ionization rate substantially independent of said vaporization rate by adjusting said power supplied to said cathode and thereby by adjusting current of said vacuum arc discharge.

6. A system for ionizing thermally generated material vapors, comprising, in combination:

(a) a vacuum chamber;

(b) a coolable cathode holder;

(c) a cold cathode applied to said coolable cathode holder in said vacuum chamber;

(d) means for supplying power to said cold cathode, to generate electrons from cathode spots on said cold cathode;

(e) a thermal vaporization device connected as a main anode to said cold cathode in said vacuum chamber;

(f) means for supplying power to said thermal vaporization device, to cause said thermal vaporization device to vaporize a solid in said chamber at a vaporization rate substantially dependent upon a level of said power supplied to said thermal vaporization device; and (g) a shielding wall blocking a direct line of sight from said cold cathode to said thermal vaporization device and connected as an auxiliary anode to said cold cathode, but allowing passage of a cathodic plasma stream from said cold cathode, said cathodic plasma stream being directed onto said shielding wall, whereby a vacuum arc discharge forms between said cold cathode and said thermal vaporization device, thereby causing said electrons from said cathodic plasma stream to accelerate toward said vapor, and thereby ionizing said vapor at an ionization rate substantially dependent on a level of power supplied to said cold cathode and substantially independent of said vaporization rate.

7. A system as claimed in claim 6 further comprising an ignition device for generating cathode spots on said cold cathode.

8. A system as claimed in claim 6, wherein a substrate to be coated with ionized material vapor is disposed in said vacuum chamber, and whereby said ionized vapor coats said substrate.

9. A system as claimed in claim 6, wherein said thermal vaporization device comprises a vaporizer helix connected via electrically isolated ducts to said means for supplying power to said thermal vaporization device.

10. A system as claimed in claim 6, wherein said thermal vaporization device comprises a heated crucible.

11. A system as claimed in claim 6, further comprising electrical circuitry configured to substantially prevent circumstantial influence between said means for supplying power to said thermal vaporization device and said means for supplying power to said cold cathode.

* * * * *